United States Patent
Liu et al.

(10) Patent No.: US 12,167,616 B2
(45) Date of Patent: Dec. 10, 2024

(54) BLUE ELECTROLUMINESCENT DEVICE, DISPLAY PANEL AND DISPLAY DEVICE

(71) Applicant: BOE Technology Group Co., Ltd., Beijing (CN)

(72) Inventors: Yang Liu, Beijing (CN); Lixia Qiu, Beijing (CN); Chuang Chen, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 781 days.

(21) Appl. No.: 17/364,625

(22) Filed: Jun. 30, 2021

(65) Prior Publication Data
US 2022/0059788 A1    Feb. 24, 2022

(30) Foreign Application Priority Data
Aug. 21, 2020   (CN) .......................... 202010850867.1

(51) Int. Cl.
| | |
|---|---|
| *H10K 30/80* | (2023.01) |
| *H10K 50/11* | (2023.01) |
| *H10K 50/15* | (2023.01) |
| *H10K 50/16* | (2023.01) |
| *H10K 50/17* | (2023.01) |
| *H10K 101/40* | (2023.01) |

(52) U.S. Cl.
CPC .......... *H10K 30/865* (2023.02); *H10K 50/11* (2023.02); *H10K 50/15* (2023.02); *H10K 50/16* (2023.02); *H10K 50/171* (2023.02); *H10K 2101/40* (2023.02)

(58) Field of Classification Search
CPC ............. H01L 51/5008; H01L 51/5056; H01L 51/5004; H01L 51/5092; H01L 51/5072
USPC ........................................................ 428/690
See application file for complete search history.

(56) References Cited

U.S. PATENT DOCUMENTS

| | | | |
|---|---|---|---|
| 8,823,050 B2 * | 9/2014 | Wu ........................ | H10K 71/30 |
| | | | 257/40 |
| 2016/0248030 A1 | 8/2016 | Zhang | |
| 2019/0341571 A1 * | 11/2019 | Liaptsis ................. | H10K 50/12 |
| 2020/0144504 A1 | 5/2020 | Ishisone et al. | |
| 2022/0302404 A1 | 9/2022 | Qiu et al. | |

FOREIGN PATENT DOCUMENTS

| | | | | | |
|---|---|---|---|---|---|
| CN | 103762317 A | | 4/2014 | | |
| CN | 105957971 A | | 9/2016 | | |
| CN | 108232025 A | * | 6/2018 | ......... | H01L 51/5016 |
| CN | 111048675 A | | 4/2020 | | |
| CN | 111293228 A | | 6/2020 | | |
| CN | 111554821 A | | 8/2020 | | |

OTHER PUBLICATIONS

CN2020108508671 first office action.
CN2020108508671 second office action.

* cited by examiner

*Primary Examiner* — Satya B Sastri
(74) *Attorney, Agent, or Firm* — IPro, PLLC

(57) ABSTRACT

A blue electroluminescent device includes: an anode, a light-emitting layer and a cathode stacked in sequence; wherein the light-emitting layer comprises a first type host material, a second type host material, and a guest doped material, one of the first type host material and the second type host material is a P-type material, and the other of the first type host material and the second type host material is an N-type material. A display panel and a display device are further provided.

20 Claims, 4 Drawing Sheets

BLUE ELECTROLUMINESCENT DEVICE, DISPLAY PANEL AND DISPLAY DEVICE

CROSS REFERENCE TO RELATED APPLICATIONS

This disclosure claims the priority of a Chinese patent application filed with National Intellectual Property Administration, P. R. C., under CN 202010850867.1, entitled "Blue Electroluminescent Device, Display Panel And Display Device" on Aug. 21, 2020, the entire contents of which are incorporated by reference in this disclosure.

TECHNICAL FIELD

Embodiments of the present disclosure relate to a blue electroluminescent device, a display panel, and a display device.

BACKGROUND

Currently broadly used OLED devices include an anode, a light-emitting layer, and a cathode. Under effect of an external electric field, holes applied by the anode and electrons applied by the cathode combines in the light-emitting layer and energy excitons are generated in the light-emitting layer to excite organic luminescent material molecules to emit light.

As Organic Light Emitting Diodes (OLEDs) screens have characteristics of self-luminous, high contrast, light and thin, fast response, wide viewing angle, low power consumption, wide applicable temperature range, low cost, simple manufacturing process, etc. In recent years, they have been widely used in various fields, such as car monitors, computer displays, TV screens, mobile phone screens and the like, and have broad application prospects.

With the widespread application of OLED devices, higher and higher requirements are raised on their performance. However, current blue OLED devices still have problems such as relatively high voltage, low light-emitting efficiency, and short lifespan. The current blue electroluminescent devices, display panels and display devices need to be further improved.

SUMMARY

At least one embodiment of the present disclosure provides a blue electroluminescent device, including: an anode, a light-emitting layer and a cathode stacked in sequence; wherein the light-emitting layer includes a first type host material, a second type host material, and a guest doped material, one of the first type host material and the second type host material is a P-type material, and the other of the first type host material and the second type host material is an N-type material.

In an embodiment of the present disclosure, a Lowest Unoccupied Molecular Orbital (LUMO) energy level of the N-type material is not less than 2.1 eV and not greater than 3.3 eV; a Highest Occupied Molecular Orbital (HOMO) energy level of the P-type material is not less than 5.5 eV and not more than 6.5 eV; a difference between the HOMO energy level of the P-type material and the LUMO energy level of an N-type material is not less than 2.6 eV.

In an embodiment of the present disclosure, a mole ratio of the P-type material to the N-type material ranges from 1:4 to 4:1.

In an embodiment of the present disclosure, a hole mobility of the P-type material ranges from $10^{-8}$ cm$^2$/(V·s) to $10^{-4}$ cm$^2$/(V·s), and an electron mobility of the N-type material ranges from $10^{-8}$ cm$^2$/(V·s) to $10^{-4}$ cm$^2$/(V·s).

In an embodiment of the present disclosure, the P-type material includes at least one of:

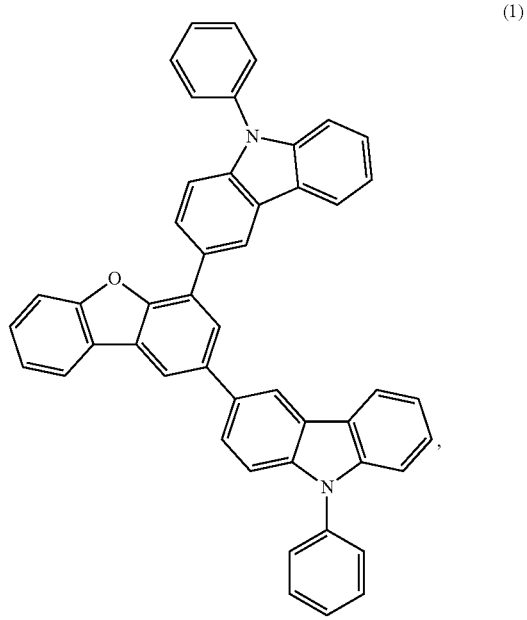

(1)

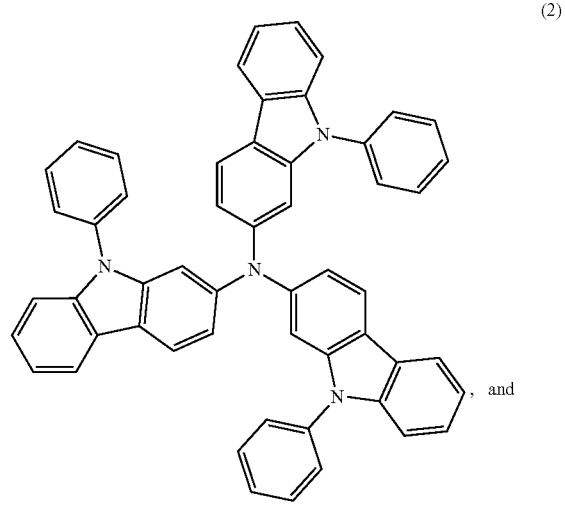

, and (2)

-continued (3)

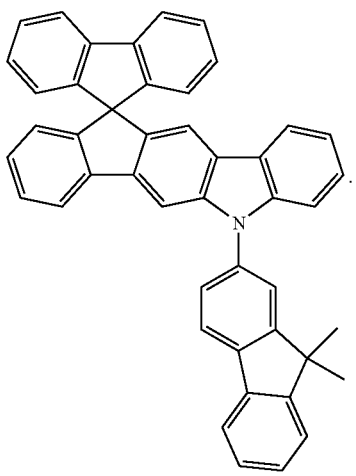

In an embodiment of the present disclosure, the N-type material includes at least one of:

(4)

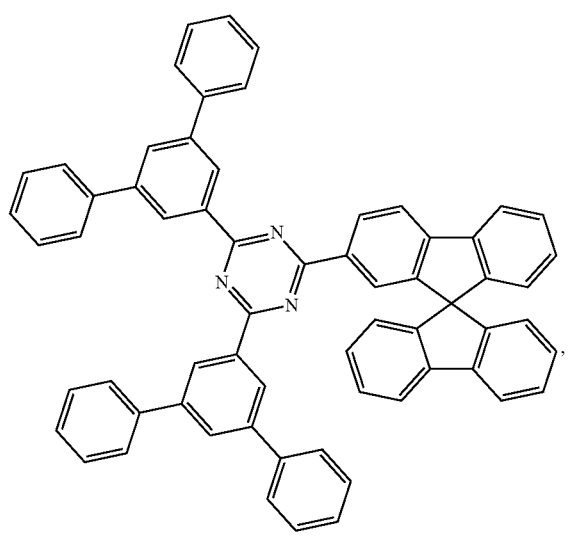

(5)

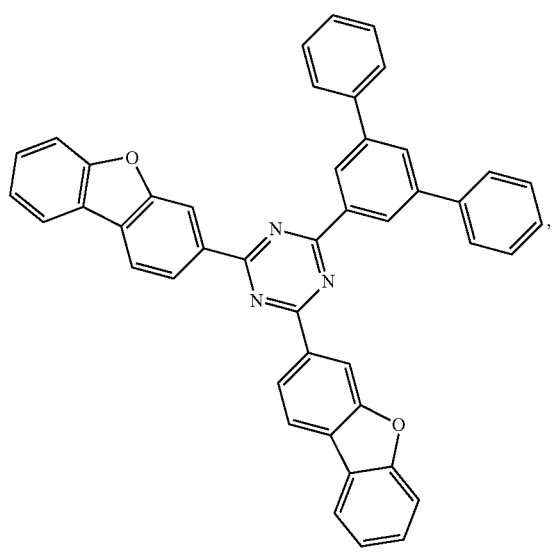

(6)

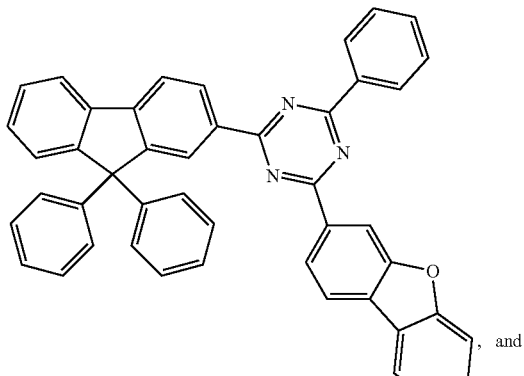

, and (7)

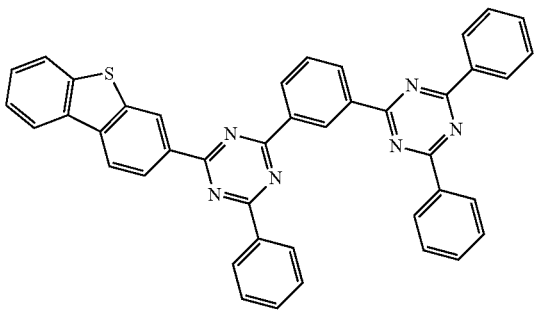

.

In an embodiment of the present disclosure, the cathode is formed of Mg and Ag, a mole ratio of Mg to Ag ranges from 1:9 to 9:1, and a thickness of the cathode ranges from 10 nm to 100 nm.

In an embodiment of the present disclosure, the cathode is formed of Mg and Ag, a mole ratio of Mg to Ag ranges from 1:9 to 9:1, and a thickness of the cathode ranges from 10 nm to 100 nm.

In an embodiment of the present disclosure, the blue electroluminescent device further includes: a hole transport layer, disposed between the anode and the light-emitting layer; a hole injection layer, disposed between the anode and the hole transport layer; an electron blocking layer, disposed between the hole transport layer and the light-emitting layer; an electron transport layer, disposed between the cathode and the light-emitting layer; an electron injection layer, disposed between the cathode and the electron transport layer; and a hole blocking layer, disposed between the electron transport layer and the light-emitting layer.

In an embodiment of the present disclosure, a difference between an absolute value of the HOMO energy level of the P-type material and an absolute value of a HOMO energy level of the electron blocking layer is not greater than 0.3 eV; and a difference between an absolute value of a LUMO energy level of the hole blocking layer and an absolute value of the LUMO energy level of the N-type material is not more than 0.3 eV.

In an embodiment of the present disclosure, a thickness of the hole injection layer ranges from 8 nm to 12 nm, a thickness of the hole transport layer ranges from 100 nm to 120 nm, and a thickness of the electron blocking layer ranges from 3 nm to 7 nm, a thickness of the light-emitting layer ranges from 15 nm to 25 nm, a thickness of the hole blocking layer ranges from 3 nm to 7 nm, a thickness of the electron transport layer ranges from 25 nm to 35 nm, and a thickness of the electron injection layer ranges from 1 nm to 2 nm.

In an embodiment of the present disclosure, the blue electroluminescent device further includes: a thickness of the hole injection layer is 1 nm, a thickness of the electron blocking layer is 5 nm, a thickness of the light-emitting layer is 20 nm, a thickness of the hole blocking layer is 5 nm, a thickness of the electron transport layer is 30 nm, and a thickness of the electron injection layer is 1 nm.

At least one embodiment of the present disclosure provides a display panel including the blue electroluminescent device as described above.

At least one embodiment of the present disclosure provides a display device including the display panel as described above.

BRIEF DESCRIPTION OF THE DRAWINGS

The above described and/or additional aspects and advantages of the present disclosure will become obvious and easy to understand from the description of the embodiments in conjunction with the following drawings, in which.

REFERENCE SIGNS

Figure 1:
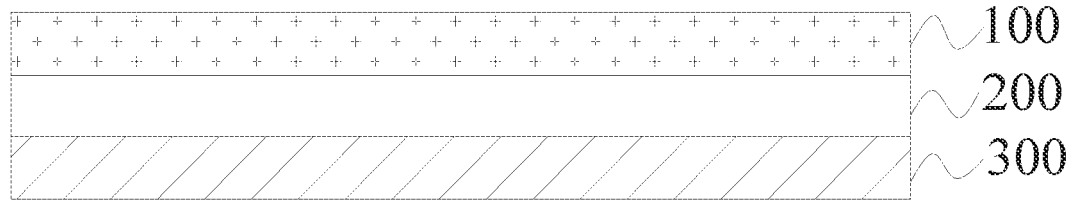
FIG. 1 illustrates a schematic structural view of a blue electroluminescent device according to an embodiment of the present disclosure.

100: anode; 200: light-emitting layer; 300: cathode; 400: hole injection layer; 500: hole transport layer; 600: electron blocking layer; 700: hole blocking layer; 800: electron transport layer; 900: electron injection layer.

DETAILED DESCRIPTION OF THE EMBODIMENTS

Embodiments of the present disclosure will be described in detail hereinafter. Examples of the embodiments are illustrated in the accompanying drawings, in which the same or similar reference numerals designate the same or similar elements or elements with the same or similar functions. The embodiments described hereinafter with reference to the drawings are exemplary, and are only intended to explain the present disclosure, and should not be construed as a limit to the present disclosure.

In current electroluminescent devices, a material of the light-emitting layer typically includes a host material and a guest doped materials. The host material will greatly affect distribution of an exciton recombination area. A bipolar host material refers to a host material contains both a P-type (Hole type) material and an N-type (electronic type) material. The mixture of the P-type material and the N-type material will generate an exciplex under light excitation or electric field excitation. The bipolar host material makes a balance between transmissions of holes and/or electrons, such that the exciton recombination area is more dispersed. A unipolar host material refers to a host material that only contains a P-type material or an N-type material, and its transport of holes and/or electrons is unbalanced, resulting in that the exciton recombination area is mainly distributed at an interface between the light-emitting layer and an adjacent functional layer. Concentration of excitons at the interface is relatively high, and exciton quenching is prone to occur, that is, the excitons decay or disappear in a short period of time, resulting in a decrease in the light-emitting efficiency of the electroluminescent device. In addition, the excitons recombine at the interface for a long time, which tends to aggravate deterioration of the interface, shortening the life of the device.

Currently, a host material of a light-emitting layer of a red light OLED device and a green light OLED device is typically a bipolar host material, and a host material of a light-emitting layer of a blue OLED device is still a unipolar host material, and is typically an electron type material.

The inventors found that it is very challenging to adopt a bipolar host material as a host material of the light-emitting layer of the blue OLED device. After a P-type material and an N-type material are matched to form a premixing host material, an energy level thereof of the premixing host material is relatively low with respect to that of a P-type or an N-type material of a unipolar host material and it shifts toward a longer wavelength, it is difficult to obtain a luminescent material with a high energy level, and the energy of blue light is higher than that of red light or green light. If the P-type material and the N-type material are not matched well, performance of the obtained bipolar host material may even be worse than that of the currently used unipolar host material, and the blue OLED device formed of it also has a relatively poor performance. Therefore, only unipolar host materials can be used in the current host material of the light-emitting layer of the blue OLED device.

Researches by the inventors show that physical properties of a P-type material and an N-type material of a bipolar host material of the blue OLED device light-emitting layer may be defined, so that a spectral overlap integral between a photoluminescent spectrum (PL spectrum) of the bipolar host material and an absorption spectrum of a guest doped material is increased, and a combination of high-efficiency energy transfer is produced, which broadens the exciton recombination area, and improves efficiency and lifespan of the blue light device.

At least one embodiment of the present disclosure provides a blue electroluminescent device. Referring to FIG. 1, the blue electroluminescent device includes: an anode 100, a light-emitting layer 200, and a cathode 300 stacked in sequence. The light-emitting layer 200 includes a first type host material, a second type host material, and a guest doped material. One of the first type host material and the second type host material is a P-type material, and the other of the first type host material and the second type host material is an N-type material.

Figure 2:
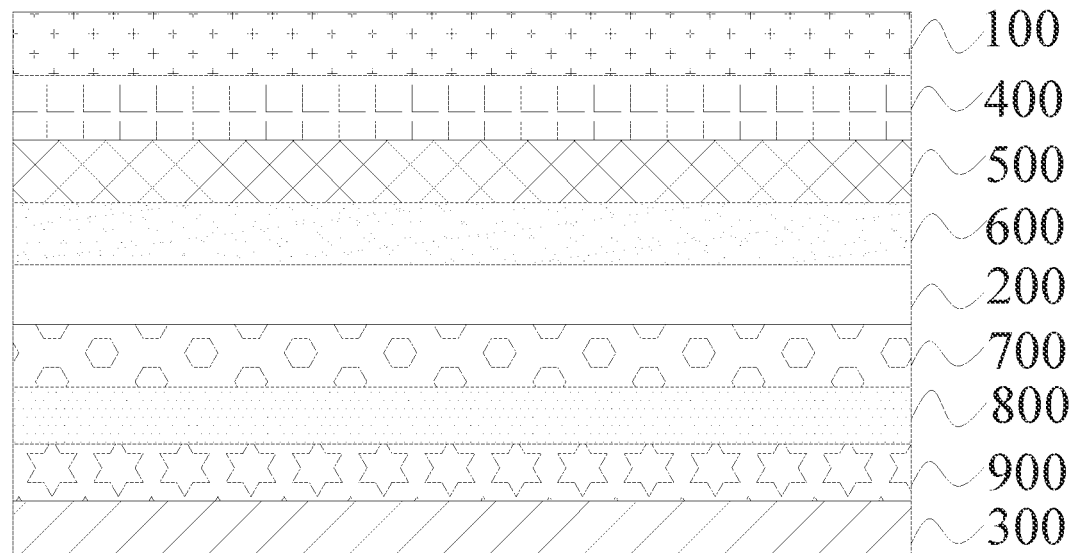
FIG. 2 illustrates a schematic structural view of a blue electroluminescent device according to another embodiment of the present disclosure.
Figure 3:
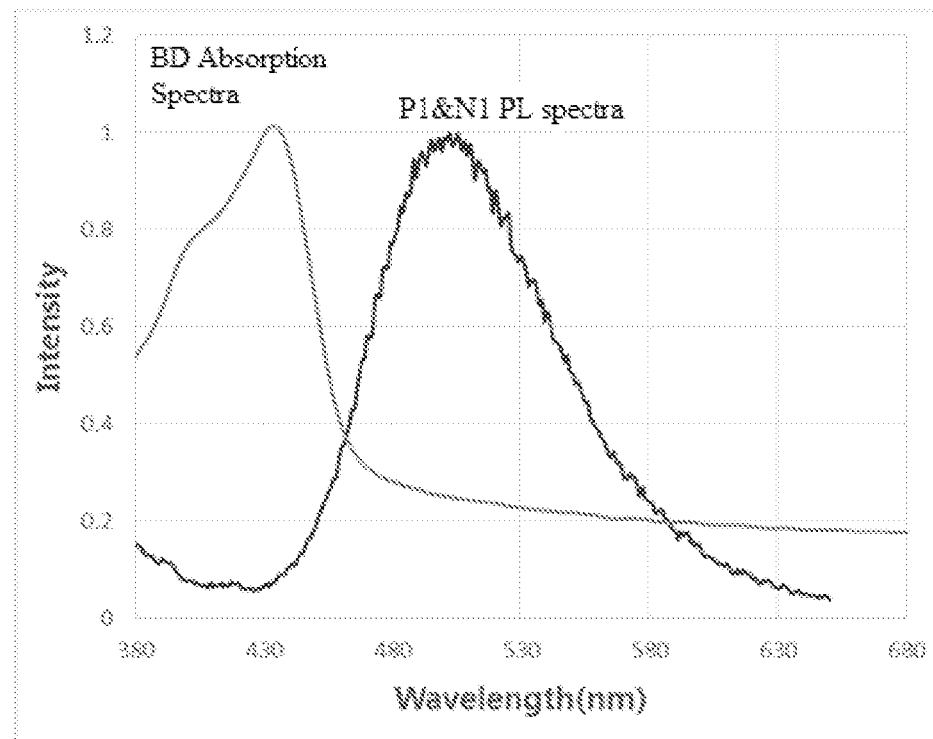
FIG. 3 illustrates a spectrogram according to an embodiment of the present disclosure.
Figure 4:
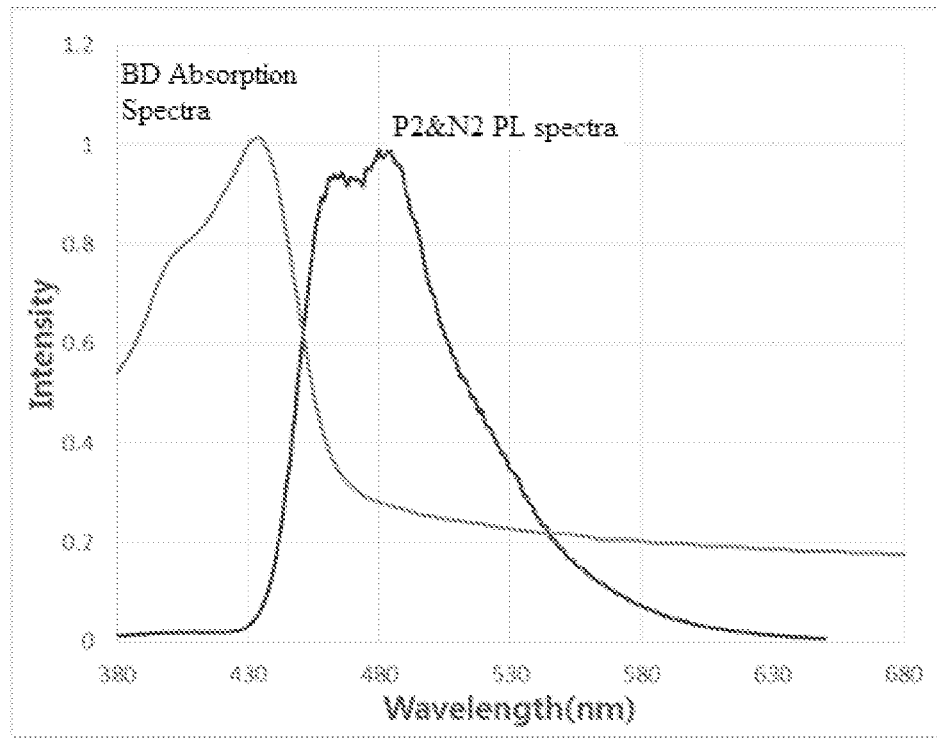
FIG. 4 illustrates a spectrogram according to another embodiment of the present disclosure.
Figure 5:
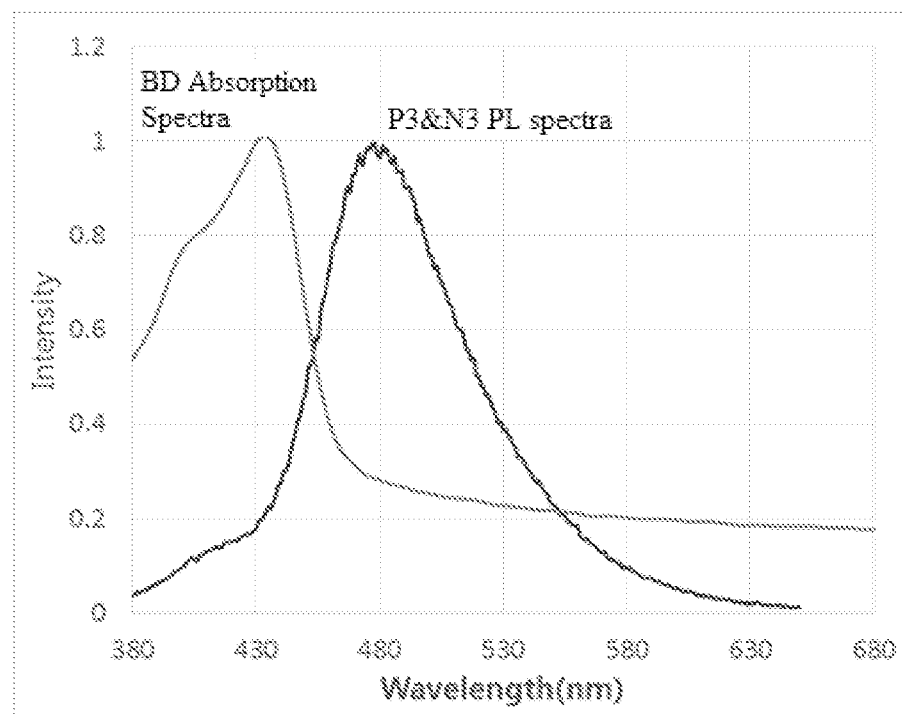
FIG. 5 illustrates a spectrogram according to yet another embodiment of the present disclosure.
Figure 6:
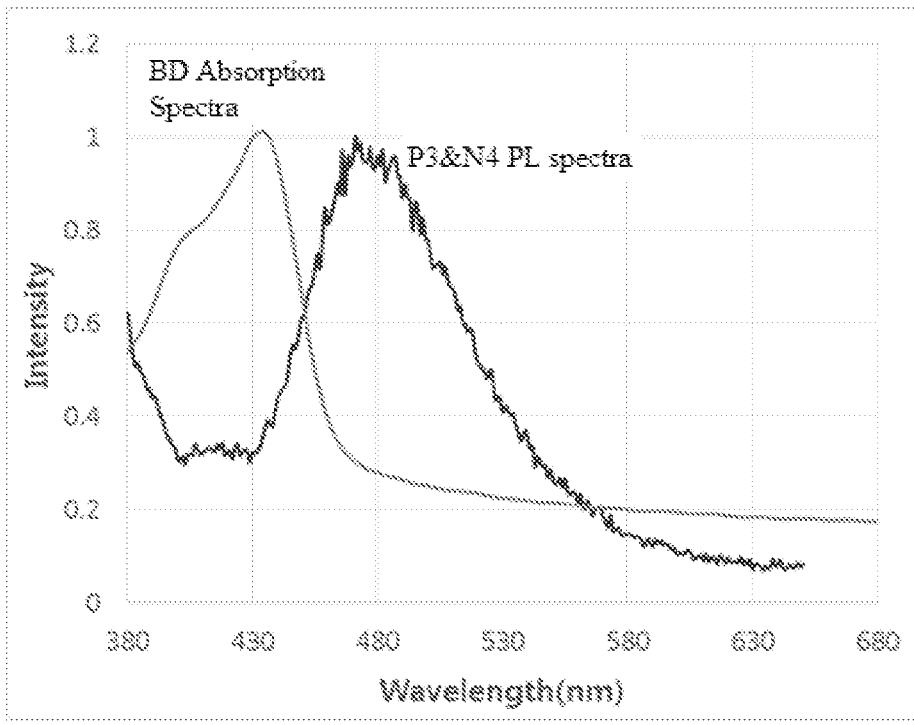
FIG. 6 illustrates a spectrogram according to still another embodiment of the present disclosure.
Figure 7:
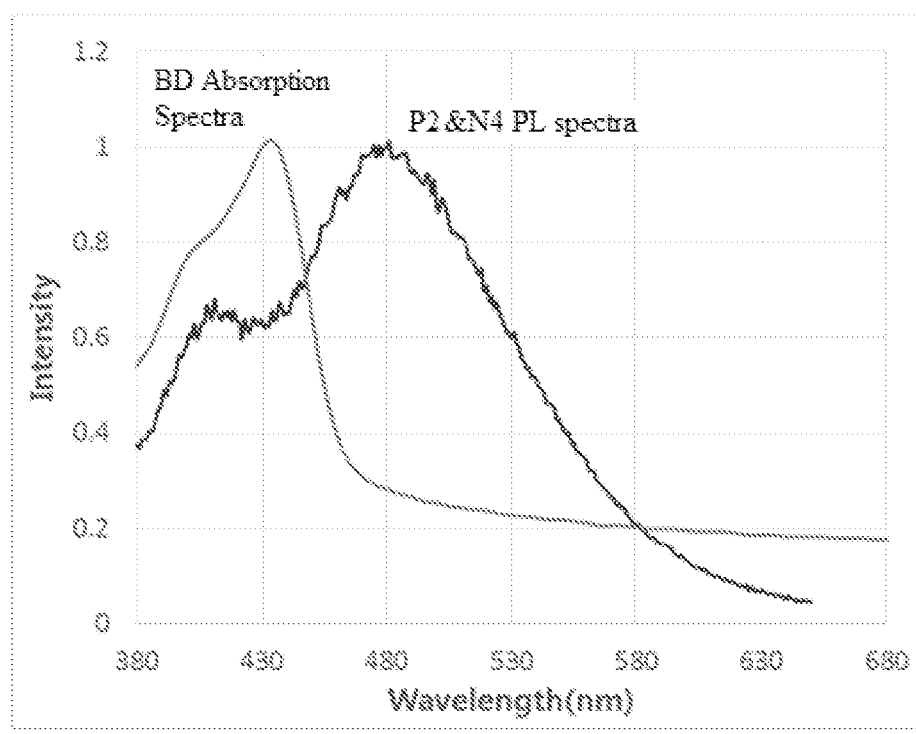
FIG. 7 illustrates a spectrogram according to yet another embodiment of the present disclosure.

In an embodiment of the present disclosure, referring to FIG. 2, the blue electroluminescent device further includes: a hole transport layer 500, an electron transport layer 800, a hole injection layer 400, an electron blocking layer 600, a hole blocking layer 700, and an electron injection layer 900; wherein the hole transport layer 500 is disposed between the anode 100 and the light-emitting layer 200, the hole injection layer 400 is disposed between the anode 100 and the hole transport layer 500, and the electron blocking layer 600 is disposed between the hole transport layer 500 and the light-emitting layer 200, the electron transport layer 800 is disposed between the cathode 300 and the light-emitting layer 200, the electron injection layer 900 is disposed between the cathode 300 and the electron transport layer 800, and the hole blocking layer 700 is disposed between the electron transport layer 800 and the light-emitting layer 200. This facilitates transport of holes from the anode 100 to the light-emitting layer 200 and transport of electrons from the cathode 300 to the light-emitting layer 200, and promotes the recombination of holes and electrons in the light-emitting layer 200, thereby improving the light-emitting efficiency of the device.

In the case that the light-emitting layer 200 contains both the P-type host material and the N-type host material, exciplexes will be generated under light excitation or electric field excitation. In a case that there is a relatively large spectral overlap integral between the photoluminescent spectrum (PL spectrum) of the exciplexes and an absorption spectrum of the guest doped material, energy transfer efficiency may be improved.

In an embodiment of the present disclosure, the Lowest Unoccupied Molecular Orbital (LUMO) energy level of the N-type material is not less than 2.1 eV and not greater than 3.3 eV, that is, 2.1 eV≤$LUMO_{N\text{-}type}$≤3.3 eV; the Highest Occupied Molecular Orbital (HOMO) energy level of the P-type material is not less than 5.5 eV and not more than 6.5 eV, that is, 5.5 eV≤$HOMO_{P\text{-}type}$≤6.5 eV; a difference between the highest occupied orbital energy level of the P-type material and the LUMO energy level of the N-type material is not less than 2.6 eV, namely $HOMO_{P\ type}$−$LUMO_{N\ type}$≥2.6 eV. Therefore, both the P-type material and the N-type material have appropriate energy levels, can adjust a position of the photoluminescent (PL) spectrum of the exciplexes generated by the bipolar host material, and increase the spectral overlap integral of the PL spectrum and the absorption spectrum of the guest doped material, which improves energy transfer from the host material to the guest doped material, and increases the light-emitting efficiency of the blue electroluminescent device.

In an embodiment of the present disclosure, a difference between an absolute value of the HOMO energy level of the P-type material and an absolute value of the HOMO energy level of the electron blocking layer is not more than 0.3 eV; a difference between an absolute value of the LUMO energy level of the hole blocking layer and an absolute value of the LUMO energy level of the N-type material is not more than 0.3 eV. This facilitates transfer of holes from the anode 100 to the light-emitting layer 200 and transfer of electrons from the cathode 300 to the light-emitting layer 200, respectively, and holes are prevented from moving from the light-emitting layer 200 to the cathode 300 and electrons are prevented from moving from the light-emitting layer 200 to the anode 100, thus holes and electrons are made concentrated in the light-emitting layer 200, thereby improving the light-emitting efficiency of the device.

The types of the P-type material and the N-type material used in the present disclosure are not particularly limited, as long as the P-type material and the N-type material can match well to improve the light-emitting performance of the light-emitting layer 200.

In an embodiment of the present disclosure, the P-type material includes at least one of

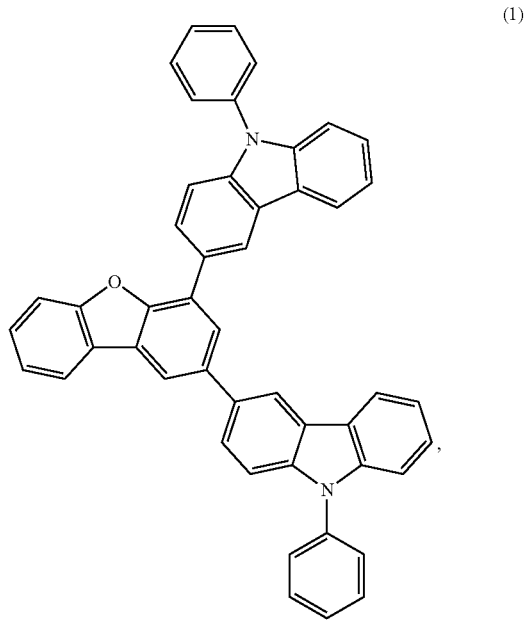

(1)

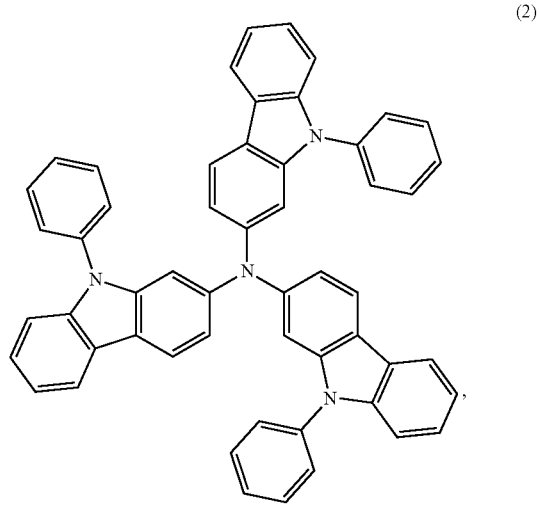

(2)

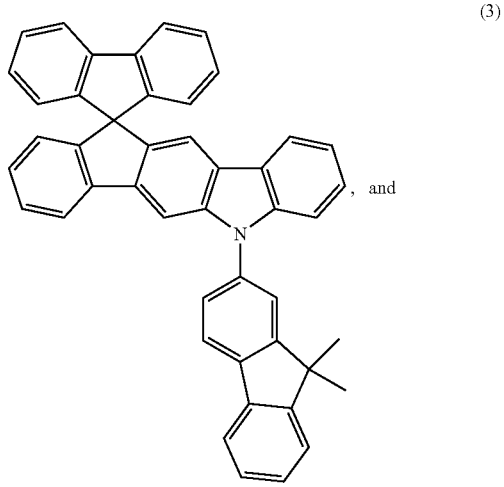

(3)

, and the N-type material includes at least one of (4)
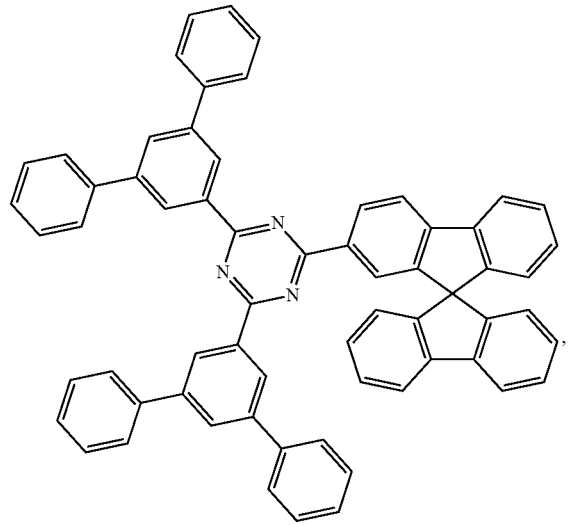

(5)
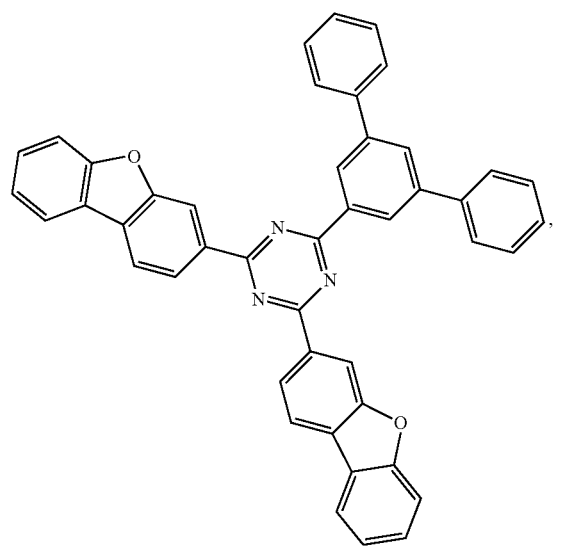

(6)
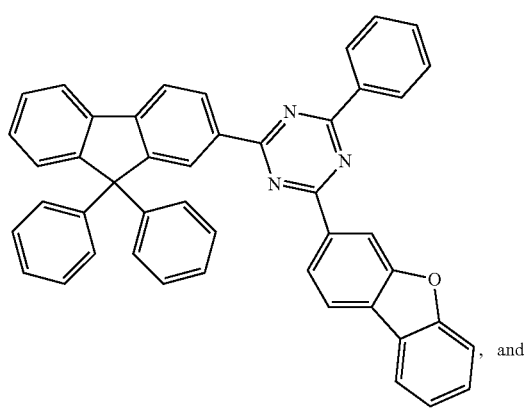
, and (7)
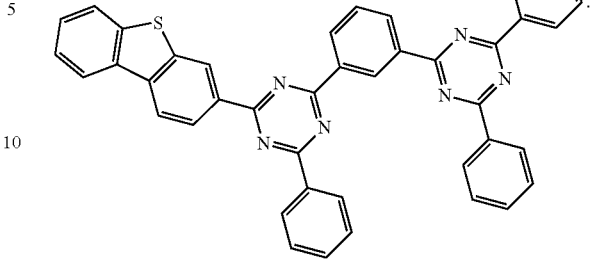

Therefore, the light-emitting layer of the blue electroluminescent device has a suitable bipolar host material, which can make the exciton recombination area move toward inside of the light-emitting layer, slow down aging of the device, prolong service life of the device, decrease an operation voltage of the device, and increase a light-emitting efficiency of the device.

In an embodiment of the present disclosure, a mole ratio of the P-type material to the N-type material may ranges from 1:4 to 4:1. Therefore, materials for the bipolar host material have a suitable proportion, thus exciton quenching can be reduced and the light-emitting efficiency of the blue electroluminescent device can be improved. And at the same time, the exciton recombination area can be moved toward inside of the light-emitting layer 200, and the exciton recombination area is no longer concentrated at the interface between the light-emitting layer 200 and an adjacent functional layer, thereby mitigating interface aging and prolonging the service life of the device.

In an embodiment of the present disclosure, the mole ratio of the P-type material to the N-type material is 1:1. As a result, the overall performance of the blue electroluminescent device can be further improved.

In an embodiment of the present disclosure, a hole mobility of the P-type material may be $10^{-8}$ to $10^{-4}$ cm$^2$/(V·s), an electron mobility of N type material may be $10^{-8}$ to $10^{-4}$ cm$^2$/(V·s). Thus, both holes and electrons have appropriate mobility in the light-emitting layer of the bipolar host material, which can improve the light-emitting efficiency of the device. In an embodiment of the present disclosure, the hole mobility of the P-type material may be $4 \times 10^{-5}$ to $7 \times 10-5$ cm$^2$/(V·s), the electron mobility of N type material may be of $3 \times 10^{-6}$ to $7 \times 10^{-6}$ cm$^2$/(V·s). As a result, the light-emitting efficiency of the light-emitting layer 200 can be further improved, and the overall performance of the device can be improved.

Materials of the anode 100 and the cathode 300 of the blue electroluminescent device according to the present disclosure are not particularly limited, as long as they are of conductivity. In some embodiments of the present disclosure, a material of the anode 100 may be indium tin oxide (ITO), and a material of the cathode 300 may be Mg and Ag. As a result, the overall performance of the device can be improved.

In an embodiment of the present disclosure, the mole ratio of Mg and Ag forming the cathode 300 may range from 1:9 to 9:1, and a thickness of the cathode may ranges from 10 nm to 100 nm. As a result, the overall performance of the blue electroluminescent device can be improved. In some embodiments of the present disclosure, a mole ratio of Mg to Ag which form the cathode 300 is 1:4, and a thickness of the cathode 300 is 80 nm. As a result, the overall performance of the blue electroluminescent device can be further improved.

Thicknesses of the light-emitting layer 200 and other functional layers in the present disclosure is not particularly limited, as long as holes and electrons can be transported to the light-emitting layer 200 from the anode 100 and the cathode 300 respectively and recombined in the light-emitting layer 200. In an embodiment of the present disclosure, a thickness of the hole injection layer 400 ranges from 8 nm to 12 nm, a thickness of the hole transport layer 500 ranges from 100 nm to 120 nm, a thickness of the electron blocking layer 600 ranges from 3 nm to 7 nm, and a thickness of the light-emitting layer 200 ranges from 15 nm to 25 nm, a thickness of the hole blocking layer 700 ranges from 3 nm to 7 nm, a thickness of the electron transport layer 800 ranges from 25 nm to 35 nm, and a thickness of the electron injection layer 900 ranges from 1 nm to 2 nm. As a result, the overall performance of the blue electroluminescent device can be improved. According to some embodiments of the present disclosure, a thickness of the hole injection layer 400 is 10 nm, the thickness of the hole transport layer 500 is 110 nm, the thickness of the electron blocking layer 600 is 5 nm, the thickness of the light-emitting layer 200 is 20 nm, and the thickness of the hole blocking layer 700 is 5 nm, the thickness of the electron transport layer 800 is 30 nm, and the thickness of the electron injection layer 900 is 1 nm. As a result, the overall performance of the blue electroluminescent device can be further improved.

At least one embodiment of the present disclosure provides a display panel including the aforementioned blue electroluminescent device. Therefore, the display panel has all the advantages of the blue electroluminescent device as described above, and will not be elaborated here. In general, the display panel has the advantages of a low operating voltage, high light-emitting efficiency, and long service life.

At least one embodiment of the present disclosure provides a display device including the display panel as described above. Therefore, the display device has the advantages of a lower operating voltage, higher light-emitting efficiency, and longer service life.

The following examples are intended to illustrate the present disclosure. One of ordinary skill in the art can understand that the following examples are only for illustrative purposes, and cannot be construed as a limit to the protection scope of the present disclosure in any way. In addition, in the following examples, unless otherwise specified, the materials and equipment used are all commercially available. If specific processing conditions and processing methods are not clearly described in the following examples, conditions and methods known in the art can be used for processing.

Example 1

P1 and N1 are respectively selected as the P-type material and the N-type material of the bipolar host material of the light-emitting layer. A mole ratio of the P-type material and the N-type material is 1:1. A guest doped material is BD, and a guest doped material accounts for about 3% of the light-emitting layer material by weight, a material of the anode is ITO, the cathode is formed of Mg and Ag with a mole ratio of 1:4, a thickness of the cathode is 80 nm, a thickness of the hole injection layer is 10 nm, a thickness of the hole transport layer is 110 nm, a thickness of the electron blocking layer is 5 nm, a HOMO energy level of the electron blocking layer is 5.5 eV, a thickness of the light-emitting layer is 20 nm, a thickness of the hole blocking layer is 5 nm, and a LUMO energy level of the hole blocking layer is 2.6 eV, a thickness of the electron transport layer is 30 nm, and a thickness of the electron injection layer is 1 nm.

Example 2

The difference from Example 1 lies in that P2 and N2 are respectively selected as the P-type material and the N-type material of the bipolar host material of the light-emitting layer.

Example 3

The difference from Example 1 lies in that P3 and N3 are respectively selected as the P-type material and the N-type material of the bipolar host material of the light-emitting layer.

Example 4

The difference from Example 1 lies in that P4 and N4 are respectively selected as the P-type material and the N-type material of the bipolar host material of the light-emitting layer.

Example 5

The difference from Example 1 lies in that P5 and N5 are respectively selected as the P-type material and the N-type material of the bipolar host material of the light-emitting layer.

Control Example 1

The difference from Example 1 lies in that a unipolar host material BH is used for the light-emitting layer.

The HOMO energy levels, the LUMO energy levels, and carrier mobilities of the host material in respective examples and the control example are illustrated in Table 1.

TABLE 1

| Material | HOMO/eV | LUMO/eV | Mobility/cm$^2$/(V · s) |
| --- | --- | --- | --- |
| P1 | 5.6 | 2.5 | $\mu_h = 6.54 \times 10^{-5}$ |
| P2 | 5.6 | 2.4 | $\mu_h = 5.62 \times 10^{-5}$ |
| P3 | 5.5 | 2.5 | $\mu_h = 4.78 \times 10^{-5}$ |
| N1 | 6.6 | 3.3 | $\mu_e = 5.56 \times 10^{-6}$ |
| N2 | 5.9 | 3.0 | $\mu_e = 3.26 \times 10^{-6}$ |
| N3 | 6.3 | 2.8 | $\mu_e = 4.54 \times 10^{-6}$ |
| N4 | 6.2 | 2.6 | $\mu_e = 4.21 \times 10^{-6}$ |
| BH | 5.9 | 3.0 | $\mu_e = 3.07 \times 10^{-7}$ |

Note: P1 is a compound indicated by formula (1), P2 is a compound indicated by formula (2), P3 is a compound indicated by formula (3), N1 is a compound indicated by formula (4), and N2 is a compound indicated by formula (5), N3 is a compound indicated by the formula (6), and N4 is the compound indicated by the formula (7).

BH is

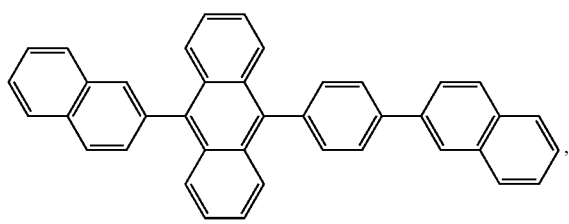
(8)

BD is

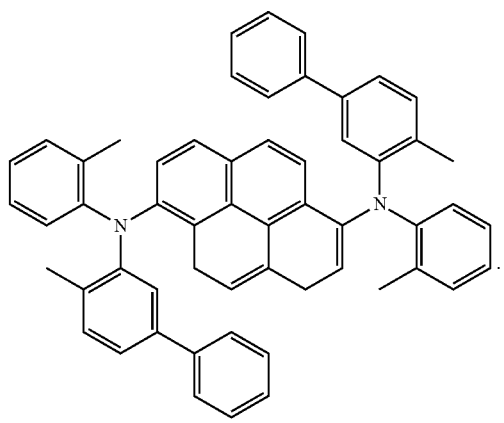 [SMILES: Cc1ccccc1N(C1=CCC2=CCc3c(N(c4ccccc4C)c4cc(-c5ccccc5)ccc4C)ccc4ccc1c2c34)c1cc(-c2ccccc2)ccc1C]
(9)

PL spectra of the bipolar host materials and absorption spectra of the guest doped materials in respective example were measured, and the test results are illustrated in FIGS. 3 to 7 of the accompanying drawings of the specification.

Referring to FIGS. 3 to 7 (the abscissa indicates the wavelength (wavelength/nm), the ordinate indicates the intensity (Intensity)), we can see the spectral overlap integral between the PL spectrum of the bipolar host material and the absorption spectrum of the respective guest doped materials in each example are relatively large, therefore, it is beneficial to improve the energy transfer from the host material to the guest doped material and improve the energy efficiency.

Routine IVL and life tests were performed on the blue electroluminescent devices in the respective examples and the control example, including voltage, current density, efficiency (Cd/A), chromaticity efficiency (Cd/A/CIE y), color coordinates (CIE) x and CIE y) and the lifetime value LT95 at which the brightness is attenuated to 95%. The test results are illustrated in Table 2.

As can be seen from Table 2, color coordinates CIE x and CIE y corresponding to the blue light, at the same current density conditions, Examples 1 to 5 have significantly lower voltage, equal or even better efficiency and chromaticity efficiency, and a significantly longer lifetime when the brightness is attenuated to 95% is significantly extended, with respect to the control example in which the unipolar host material is used.

In the embodiments of the present disclosure, the physical properties of the P-type material and the N-type material of the bipolar host material of the light-emitting layer of the blue electroluminescent device are defined, so that the spectral overlap integral between the PL spectrum of the bipolar host material and the absorption spectrum of the guest doped material is increased. Thus, a combination with high-efficiency energy transfer produced, and the exciton recombination area is widened, and with respect to the blue electroluminescent device in which a unipolar host material is used, the efficiency and chromaticity efficiency are equivalent or even better, the voltage is significantly reduced, and the lifespan is significantly prolonged.

In the description of the present disclosure, the description with reference to the terms "an embodiment", "another embodiment", "example", "some examples", etc. means that the specific feature, structure, material, or feature described in conjunction with the embodiment is included in at least one embodiment of the present disclosure. In this specification, the schematic representations of the above terms do not necessarily refer to the same embodiment or example. Moreover, the described specific features, structures, materials or characteristics can be combined in any one or more embodiments or examples of the present disclosure in a suitable manner. In addition, one of ordinary skill in the art can combine and combine different embodiments or examples and the features of different embodiments or examples described in this specification without conflict. In addition, it should be noted that in this specification, the terms "first" and "second" are only used for descriptive purposes, and cannot be understood as indicating or implying relative importance or implicitly indicating the number of indicated technical features.

Although the embodiments of the present disclosure have been illustrated and described above, it can be understood that the above-mentioned embodiments are exemplary and should not be construed as a limit to the present disclosure. One of ordinary skill in the art can make changes, modifications, substitutions, and variants to the embodiments of the present disclosure without departing the protection scope of the present disclosure.

TABLE 2

| | Voltage (V) | Current density (mA/cm$^2$) | Cd/A | Cd/A/CIE y | CIE x | CIE y | LT95(h) |
| --- | --- | --- | --- | --- | --- | --- | --- |
| Example 1 | 3.78 | 15 | 6.21 | 47.40 | 0.135 | 0.131 | 456 |
| Example 2 | 3.76 | 15 | 6.28 | 47.58 | 0.134 | 0.132 | 472 |
| Example 3 | 3.74 | 15 | 6.35 | 48.47 | 0.132 | 0.131 | 488 |
| Example 4 | 3.75 | 15 | 6.88 | 52.12 | 0.133 | 0.132 | 474 |
| Example 5 | 3.72 | 15 | 7.02 | 53.59 | 0.134 | 0.131 | 492 |
| Comparative example 1 | 3.85 | 15 | 6.47 | 48.65 | 0.135 | 0.133 | 421 |

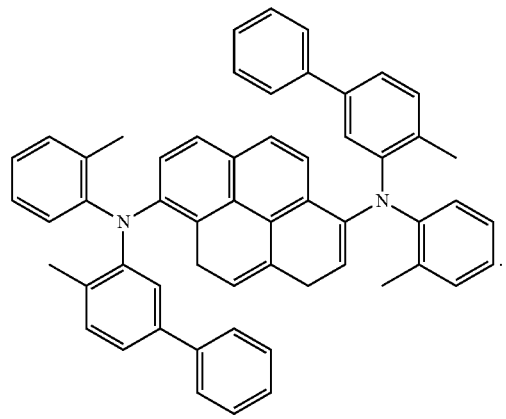 [SMILES: Cc1ccccc1N(C1=CCC2=CCc3c(N(c4ccccc4C)c4cc(-c5ccccc5)ccc4C)ccc4ccc1c2c34)c1cc(-c2ccccc2)ccc1C]

20. The blue electroluminescent device according to claim 7, wherein the guest doped material comprise
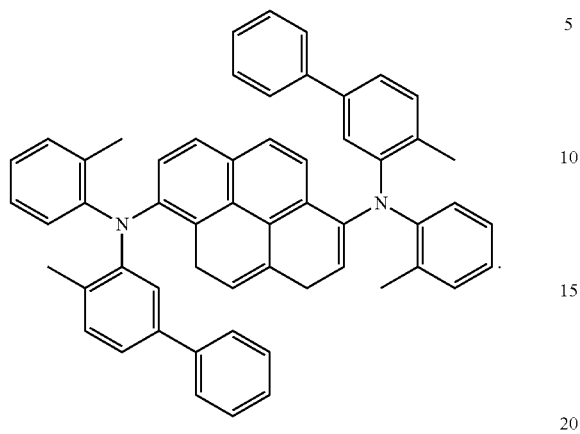

The invention claimed is:

1. A blue electroluminescent device comprising: an anode, a light-emitting layer and a cathode stacked in sequence; wherein the light-emitting layer comprises a first type host material, a second type host material, and a guest doped material, one of the first type host material and the second type host material is a P-type material, and the other of the first type host material and the second type host material is an N-type material; wherein the P-type material comprises at least one of

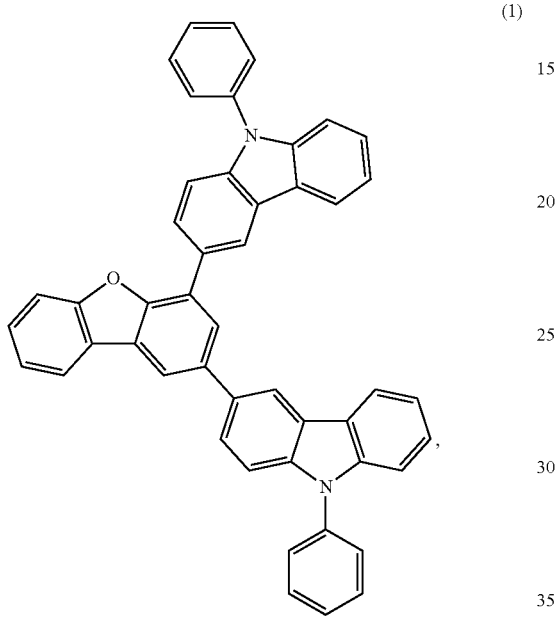

(1)

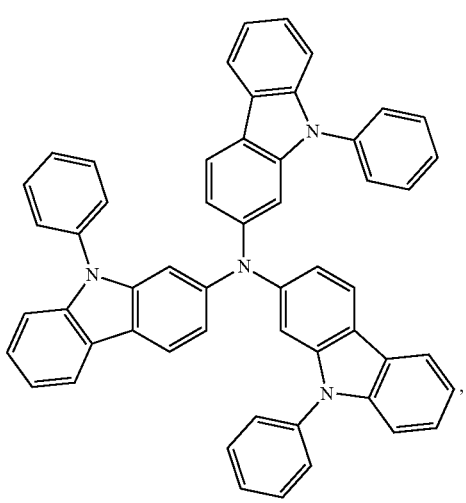

(2)

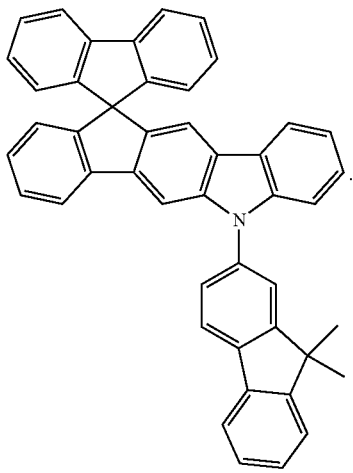

(3)

2. The blue electroluminescent device according to claim 1, wherein a Lowest Unoccupied Molecular Orbital (LUMO) energy level of the N-type material is not less than 2.1 eV and not greater than 3.3 eV; a Highest Occupied Molecular Orbital (HOMO) energy level of the P-type material is not less than 5.5 eV and not more than 6.5 eV; a difference between the HOMO energy level of the P-type material and the LUMO energy level of the N-type material is not less than 2.6 eV.

3. The blue electroluminescent device according to claim 1, wherein a mole ratio of the P-type material to the N-type material ranges from 1:4 to 4:1.

4. The blue electroluminescent device according to claim 1, wherein a hole mobility of the P-type material ranges from $10^{-8}$ cm$^2$/(V·s) to $10^{-4}$ cm$^2$/(V·s), and an electron mobility of the N-type material ranges from $10^{-8}$ cm$^2$/(V·s) to $10^{-4}$ cm$^2$/(V·s).

5. A blue electroluminescent device comprising: an anode, a light-emitting layer and a cathode stacked in sequence; wherein the light-emitting layer comprises a first type host material, a second type host material, and a guest doped material, one of the first type host material and the second type host material is a P-type material, and the other of the first type host material and the second type host material is an N-type material, wherein the N-type material comprises at least one of (4)

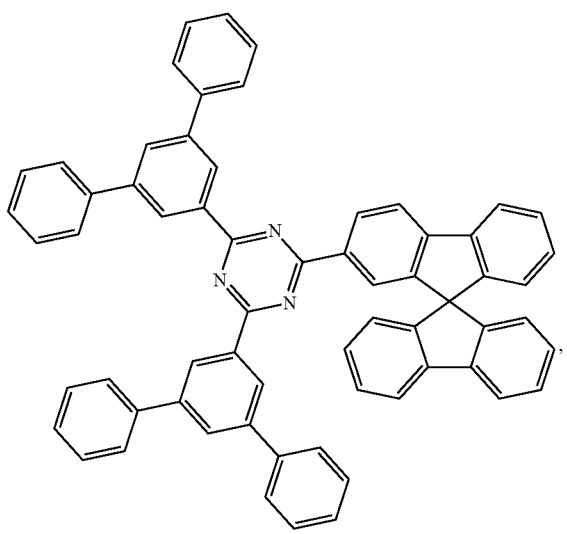

(5)

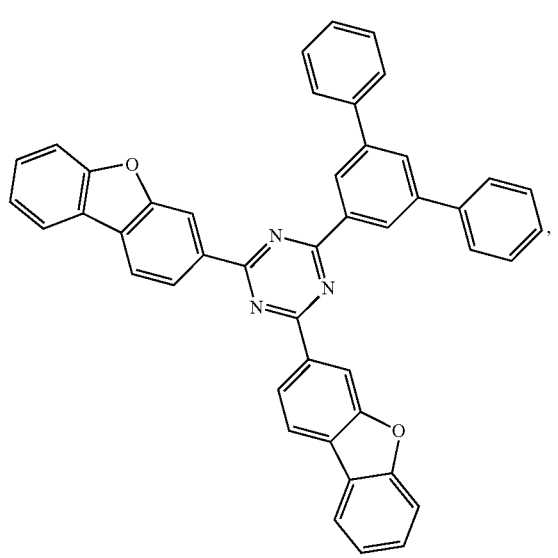

(6)

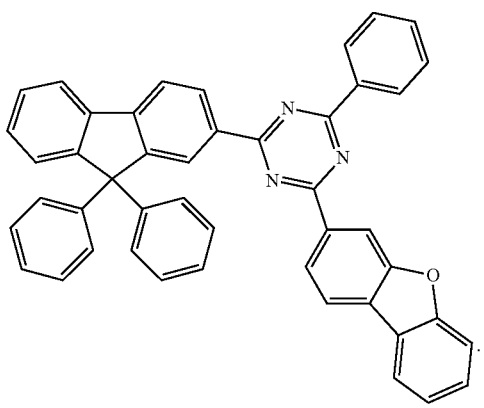

(7)

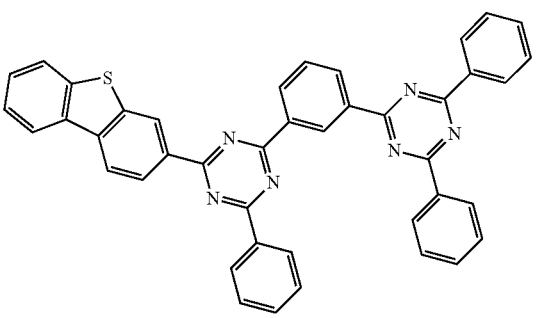

6. The blue electroluminescent device according to claim 1, wherein the cathode is formed of Mg and Ag, a mole ratio of Mg to Ag ranges from 1:9 to 9:1, and a thickness of the cathode ranges from 10 nm to 100 nm.

7. A blue electroluminescent device comprising: an anode, a light-emitting layer and a cathode stacked in sequence;
wherein the light-emitting layer comprises a first type host material, a second type host material, and a guest doped material, one of the first type host material and the second type host material is a P-type material, and the other of the first type host material and the second type host material is an N-type material, further comprising:
a hole transport layer, disposed between the anode and the light-emitting layer;
a hole injection layer, disposed between the anode and the hole transport layer;
an electron blocking layer, disposed between the hole transport layer and the light-emitting layer;
an electron transport layer, disposed between the cathode and the light-emitting layer;
an electron injection layer, disposed between the cathode and the electron transport layer; and
a hole blocking layer, disposed between the electron transport layer and the light-emitting layer;
wherein a difference between an absolute value of a HOMO energy level of the P-type material and an absolute value of a HOMO energy level of the electron blocking layer is not greater than 0.3 eV; and
a difference between an absolute value of a LUMO energy level of the hole blocking layer and an absolute value of a LUMO energy level of the N-type material is not more than 0.3 eV.

8. The blue electroluminescent device according to claim 7, wherein a thickness of the hole injection layer ranges from 8 nm to 12 nm, a thickness of the hole transport layer ranges from 100 nm to 120 nm, and a thickness of the electron blocking layer ranges from 3 nm to 7 nm, a thickness of the light-emitting layer ranges from 15 nm to 25 nm, a thickness of the hole blocking layer ranges from 3 nm to 7 nm, a thickness of the electron transport layer ranges from 25 nm to 35 nm, and a thickness of the electron injection layer ranges from 1 nm to 2 nm.

9. The blue electroluminescent device according to claim 1, further comprising:
a hole transport layer, disposed between the anode and the light-emitting layer;
a hole injection layer, disposed between the anode and the hole transport layer;
an electron blocking layer, disposed between the hole transport layer and the light-emitting layer;

an electron transport layer, disposed between the cathode and the light-emitting layer;
an electron injection layer, disposed between the cathode and the electron transport layer; and
a hole blocking layer, disposed between the electron transport layer and the light-emitting layer.

10. The blue electroluminescent device according to claim 9, wherein a difference between an absolute value of a HOMO energy level of the P-type material and an absolute value of a HOMO energy level of the electron blocking layer is not greater than 0.3 eV; and
a difference between an absolute value of a LUMO energy level of the hole blocking layer and an absolute value of a LUMO energy level of the N-type material is not more than 0.3 eV.

11. The blue electroluminescent device according to claim 9, wherein a thickness of the hole injection layer ranges from 8 nm to 12 nm, a thickness of the hole transport layer ranges from 100 nm to 120 nm, and a thickness of the electron blocking layer ranges from 3 nm to 7 nm, a thickness of the light-emitting layer ranges from 15 nm to 25 nm, a thickness of the hole blocking layer ranges from 3 nm to 7 nm, a thickness of the electron transport layer ranges from 25 nm to 35 nm, and a thickness of the electron injection layer ranges from 1 nm to 2 nm.

12. The blue electroluminescent device of claim 5, further comprising:
a hole transport layer, disposed between the anode and the light-emitting layer;
a hole injection layer, disposed between the anode and the hole transport layer;
an electron blocking layer, disposed between the hole transport layer and the light-emitting layer;
an electron transport layer, disposed between the cathode and the light-emitting layer;
an electron injection layer, disposed between the cathode and the electron transport layer; and
a hole blocking layer, disposed between the electron transport layer and the light-emitting layer.

13. The blue electroluminescent device according to claim 12, wherein a difference between an absolute value of a HOMO energy level of the P-type material and an absolute value of a HOMO energy level of the electron blocking layer is not greater than 0.3 eV; and
a difference between an absolute value of a LUMO energy level of the hole blocking layer and an absolute value of a LUMO energy level of the N-type material is not more than 0.3 eV.

14. The blue electroluminescent device according to claim 12, wherein a thickness of the hole injection layer ranges from 8 nm to 12 nm, a thickness of the hole transport layer ranges from 100 nm to 120 nm, and a thickness of the electron blocking layer ranges from 3 nm to 7 nm, a thickness of the light-emitting layer ranges from 15 nm to 25 nm, a thickness of the hole blocking layer ranges from 3 nm to 7 nm, a thickness of the electron transport layer ranges from 25 nm to 35 nm, and a thickness of the electron injection layer ranges from 1 nm to 2 nm.

15. The blue electroluminescent device of claim 6, further comprising:
a hole transport layer, disposed between the anode and the light-emitting layer;
a hole injection layer, disposed between the anode and the hole transport layer;
an electron blocking layer, disposed between the hole transport layer and the light-emitting layer;
an electron transport layer, disposed between the cathode and the light-emitting layer;
an electron injection layer, disposed between the cathode and the electron transport layer; and
a hole blocking layer, disposed between the electron transport layer and the light-emitting layer.

16. The blue electroluminescent device according to claim 15, wherein a difference between an absolute value of a HOMO energy level of the P-type material and an absolute value of a HOMO energy level of the electron blocking layer is not greater than 0.3 eV; and
a difference between an absolute value of a LUMO energy level of the hole blocking layer and an absolute value of a LUMO energy level of the N-type material is not more than 0.3 eV.

17. A display panel comprising the blue electroluminescent device according to claim 1.

18. The blue electroluminescent device according to claim 1, wherein the guest doped material comprise

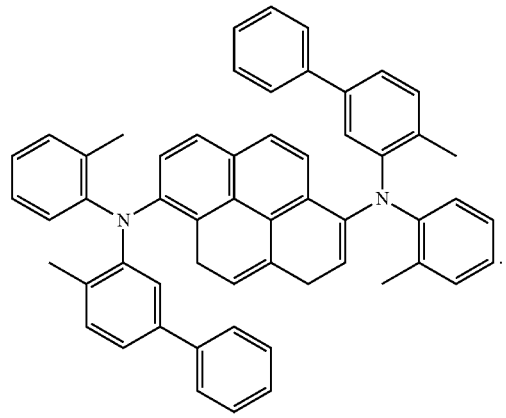 [SMILES: Cc1ccccc1N(C1=CCC2=CCc3c(N(c4ccccc4C)c4cc(-c5ccccc5)ccc4C)ccc4ccc1c2c34)c1cc(-c2ccccc2)ccc1C]

19. The blue electroluminescent device according to claim 5, wherein the guest doped material comprise